United States Patent
Xie et al.

(10) Patent No.: US 9,425,106 B1
(45) Date of Patent: *Aug. 23, 2016

(54) METHODS OF PERFORMING FIN CUT ETCH PROCESSES FOR TAPER FINFET SEMICONDUCTOR DEVICES AND THE RESULTING DEVICES

(71) Applicant: GLOBALFOUNDRIES Inc., Grand Cayman (KY)

(72) Inventors: Ruilong Xie, Niskayuna, NY (US); Min Gyu Sung, Latham, NY (US); Chanro Park, Clifton Park, NY (US); Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/674,108

(22) Filed: Mar. 31, 2015

(51) Int. Cl.
| | |
|---|---|
| H01L 21/308 | (2006.01) |
| H01L 21/8238 | (2006.01) |
| H01L 21/311 | (2006.01) |
| H01L 21/768 | (2006.01) |
| H01L 29/78 | (2006.01) |
| H01L 29/66 | (2006.01) |
| H01L 21/306 | (2006.01) |
| H01L 21/321 | (2006.01) |
| H01L 21/3213 | (2006.01) |
| H01L 21/8234 | (2006.01) |
| H01L 21/84 | (2006.01) |

(52) U.S. Cl.
CPC ...... *H01L 21/823821* (2013.01); *H01L 21/308* (2013.01); *H01L 21/3081* (2013.01); *H01L 21/3086* (2013.01); *H01L 21/30604* (2013.01); *H01L 21/30608* (2013.01); *H01L 21/31111* (2013.01); *H01L 21/31144* (2013.01); *H01L 21/32115* (2013.01); *H01L 21/32133* (2013.01); *H01L 21/32134* (2013.01); *H01L 21/32135* (2013.01); *H01L 21/76831* (2013.01); *H01L 21/823431* (2013.01); *H01L 21/845* (2013.01); *H01L 29/66795* (2013.01); *H01L 29/785* (2013.01)

(58) Field of Classification Search
None
See application file for complete search history.

(56) References Cited

U.S. PATENT DOCUMENTS 9,147,730 B2 * 9/2015 Xie ............... H01L 29/0692

* cited by examiner

*Primary Examiner* — Jiong-Ping Lu
(74) *Attorney, Agent, or Firm* — Amerson Law Firm, PLLC

(57) ABSTRACT

A method includes forming a plurality of fins above a substrate. At least one dielectric material is formed above and between the plurality of fins. A mask layer is formed above the dielectric material. The mask layer has an opening defined therein. A portion of the at least one dielectric material exposed by the opening is removed to expose top and sidewall surface portions of at least a subset of the fins. An etching process is performed to remove the portions of the fins in the subset exposed by removing the portion of the at least one dielectric material.

20 Claims, 7 Drawing Sheets

View X-X

View Y-Y

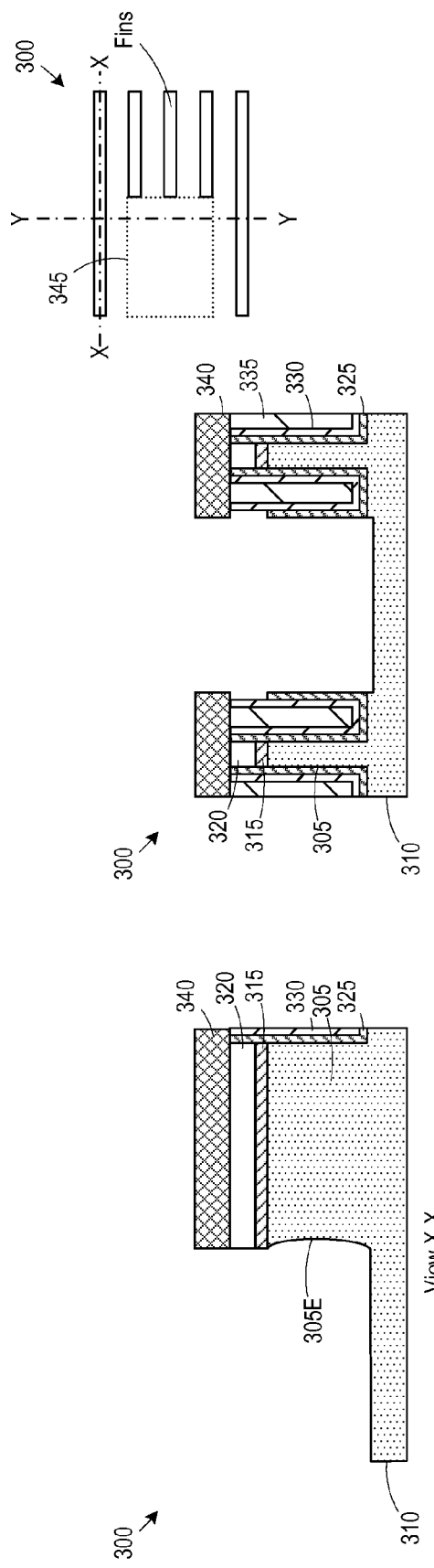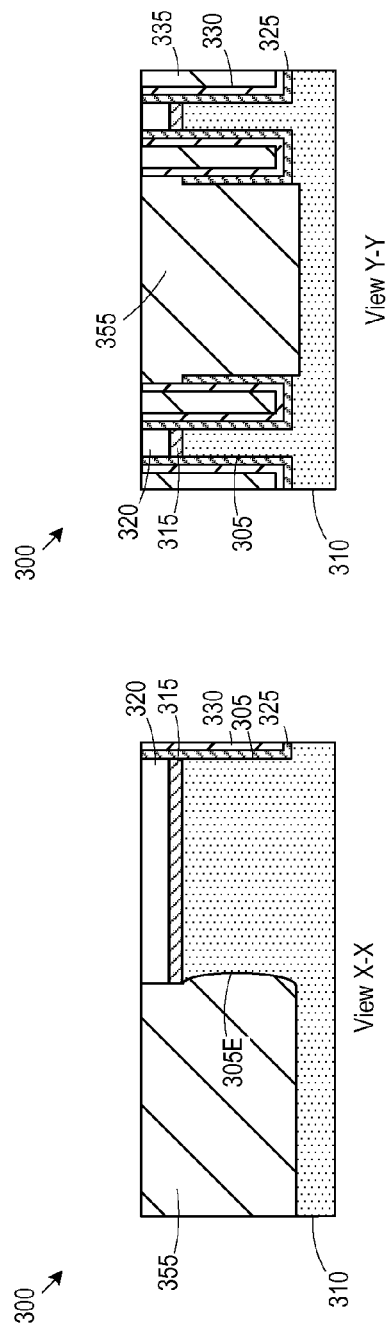
Figure 3G
Figure 3H

METHODS OF PERFORMING FIN CUT ETCH PROCESSES FOR TAPER FINFET SEMICONDUCTOR DEVICES AND THE RESULTING DEVICES

BACKGROUND OF THE INVENTION

1. Field of the Invention

The present disclosure generally relates to the fabrication of integrated circuits, and, more particularly, to various methods of performing fin cut etch processes for taper FinFET semiconductor devices and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a plan view of an illustrative prior art integrated circuit product 100 including a plurality of fins 105 formed in a semiconductor substrate 110. In this example, the product 100 includes a first FinFET device 115 having three illustrative fins 105 and a gate structure 120 formed above the fins 105. A second FinFET device 125 has two illustrative fins 105 and a gate structure 130 formed above the fins 105. An active region 135 is defined by the fins 105. Due to the difference in the number of fins 105 for each device 115, 125, the active region 135 is not rectangular. This arrangement is referred to as a tapered device in that the active region 135 is not rectangular. The active region 135 includes a taper 140 in the area that would otherwise be occupied by a portion of the lowermost fin 105 if it had the same length as the two uppermost fins 105. The use of tapered devices allows higher density layouts as compared to forming a separate active region for each device 115, 125, each having a rectangular shape.

To form the product 100, a portion of the fin 105 corresponding to the taper 140 in the active region 135 is removed. Typically, the fins 105 are formed in a regular array. To define separate transistor devices, the length of the fins may be adjusted and some fins or portions of fins may be removed, such as to form the tapered active region 135. For example, a fin cut or "FC cut" process cuts fins in the direction that crosses the plurality of fins 105 by removing fin portions inside of and exposed by the FC cut mask. An active region cut process, or "RX cut" process removes one or more of the fin segments in a direction parallel to the plurality of fins 105 by removing fin portions located outside of and exposed by the RX cut mask. In an RX cut process for a taper FinFET device, only a portion of the length of the fins) is removed. The dielectric material above the fin portions to be removed is removed to expose the tops of the underlying fin portions. A subsequent isotropic etch process removes the exposed fin portions. An isotropic etch process is used to avoid alignment problems associated with anisotropic etch processes given the small pitch of the fins. Alignment errors may result in leaving unwanted portions of fins or damaging remaining fins if an anisotropic etch were to be used. Because only the top surface is exposed during the isotropic etch, the etch front moves generally vertically downward from the exposed top of the fin toward the substrate. However, due to the nature of the isotropic etch process, the end portions of the fin portions that are intended to be retained are significantly undercut in a direction along the axial length of the fin. The degree of undercutting must be considered when designing the device.

FIGS. 2A-2B are cross-section views of a device 200 showing a fin 205 defined above a substrate 210. The fin may be defined using a variety of materials, such as silicon, an alloy of silicon, such as silicon germanium, or other semiconducting materials. In FIGS. 2A-2B, the cross-section is taken through the long axis of the fin 205. An oxide cap layer 215 and a nitride cap layer 220 (previously used as hard mask layers to pattern the fin 205 in the substrate 210) are present above a portion 205A of the fin 205 to be retained after the RX cut process. A portion 205B of the fin 205 is to be removed during the RX cut process. Liners 225, 230 may be formed on ends and the sidewalls of the fin 205. The liners 225, 230 on the end of the portion 205B that is opposite the portion 205A were previously removed during the FC cut process. The cap layers 215, 220 were selectively removed from the portion 205B so that the fin segment 205B can be removed during the RX cut process. The cap layers 215, 220 remain positioned above the portion 205A.

FIG. 2B illustrates the device 200 after the RX cut process was performed. The portion 205B is isotropically etched from the top down using the generally vertical etch front described above due to the presence of the liners 225, 230 on the sidewalls of the fin 205 (not visible in FIG. 2A or FIG. 2B). Due to the length of time needed to etch the portion 205B so as to insure its complete removal, the isotropic RX cut etch process erodes the end surface 205E, thereby reducing the length of the portion 205A that is intended to be part of an operational device. It is difficult to accurately estimate this length reduction and provide process repeatability.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fins for FinFET semiconductor devices, and the resulting semiconductor devices. One method includes, among other things, forming a plurality of fins above a substrate. At least one dielectric material is formed above and between the plurality of fins. A mask layer is formed above the dielectric material. The mask layer has an opening defined therein. A portion of the at least one dielectric material exposed by the opening is removed to expose top and sidewall surface portions of at least a subset of the fins. An etching process is performed to remove the portions of the fins in the subset exposed by removing the portion of the at least one dielectric material.

Another illustrative method disclosed herein includes, among other things, forming a plurality of fins above a substrate. Each fin has a cap layer formed on a top surface. A liner layer is formed above the plurality of fins and the cap layer. A dielectric layer is formed above the liner layer. The dielectric layer is planarized to expose a top surface of the cap layer. A mask layer is formed above the dielectric layer. The mask layer has an opening defined therein that exposes a portion of a length of each fin in a subset of the plurality of fins. A portion of the cap layer, liner layer and the dielectric layer exposed by the opening is removed to expose top and sidewall surface portions of the subset of fins. An etching process is performed to remove the portions of the fins in the subset exposed by removing the portion of the cap layer, liner layer and the dielectric layer. The etching process proceeds along a first front defined along the top surface portions and a second front defined along the sidewall surface portions.

BRIEF DESCRIPTION OF THE DRAWINGS

The disclosure may be understood by reference to the following description taken in conjunction with the accompanying drawings, in which like reference numerals identify like elements, and in which:

FIGS. 3A-3H depict one illustrative method disclosed for forming fins for a semiconductor product and the resulting semiconductor devices.

Figure 1:
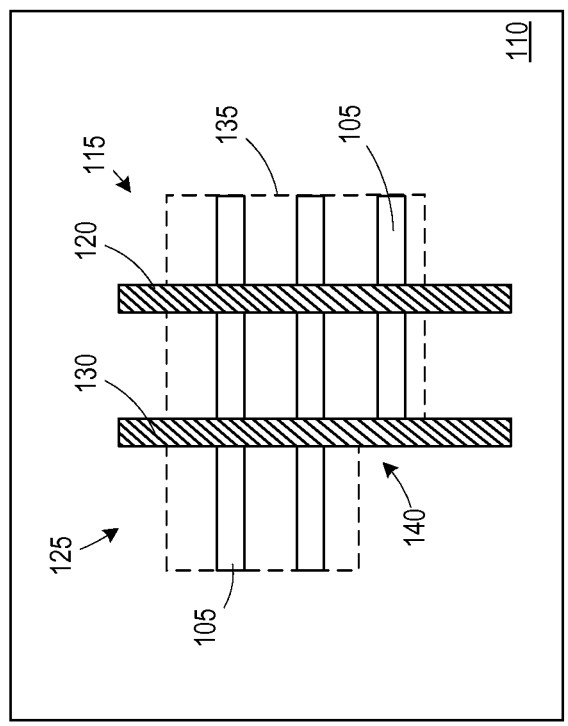
FIG. 1 is a plan view of one illustrative embodiment of a prior art semiconductor product.
Figure 2A:
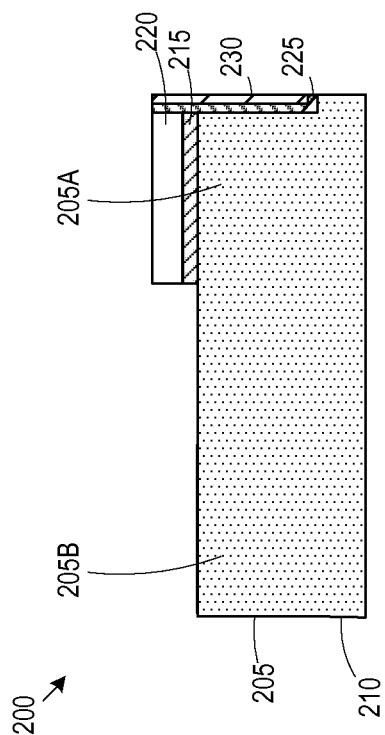
FIGS. 2A-2B depict damage to a fin caused by prior art RX cut processes.
Figure 2B:
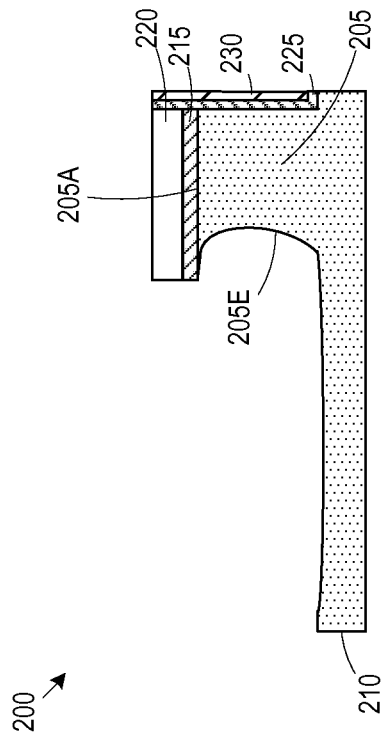

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming fins for FinFET semiconductor devices and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs.

The inventions disclosed herein should not be considered to be limited to the illustrative examples depicted and described herein. With reference to the attached figures, various illustrative embodiments of the methods and devices disclosed herein will now be described in more detail.

FIGS. 3A-3H depict one illustrative method disclosed for forming fins for semiconductor products and the resulting devices. The illustrative product 300 includes a plurality of fins 305 formed in a semiconductor substrate 310. The substrate 310 may have a variety of configurations, such as the depicted bulk silicon configuration. The substrate 310 may also have a silicon-on-insulator (SOI) configuration that includes a bulk silicon layer, a buried insulation layer and an active layer, wherein semiconductor devices are formed in and above the active layer. The substrate 310 may be formed of silicon or silicon germanium or it may be made of materials other than silicon, such as germanium. Thus, the terms "substrate" or "semiconductor substrate" should be understood to cover all semiconducting materials and all forms of such materials. The substrate 310 may have different layers.

FIGS. 3A-3H also include a simplistic plan view of the product 300 (in the upper right corner of each sheet) that depicts the location where various cross-sectional views depicted in the following drawings will be taken. More specifically, the view "X-X" is taken along the long axis of a fin 305, and the view "Y-Y" is a cross-sectional view that is taken through the plurality of fins 305 in a direction that is transverse to the long axis of the fins 305. Not all of the features illustrated in the views "X-X" and "Y-Y" are replicated in the simplistic plan view.

Figure 3A:
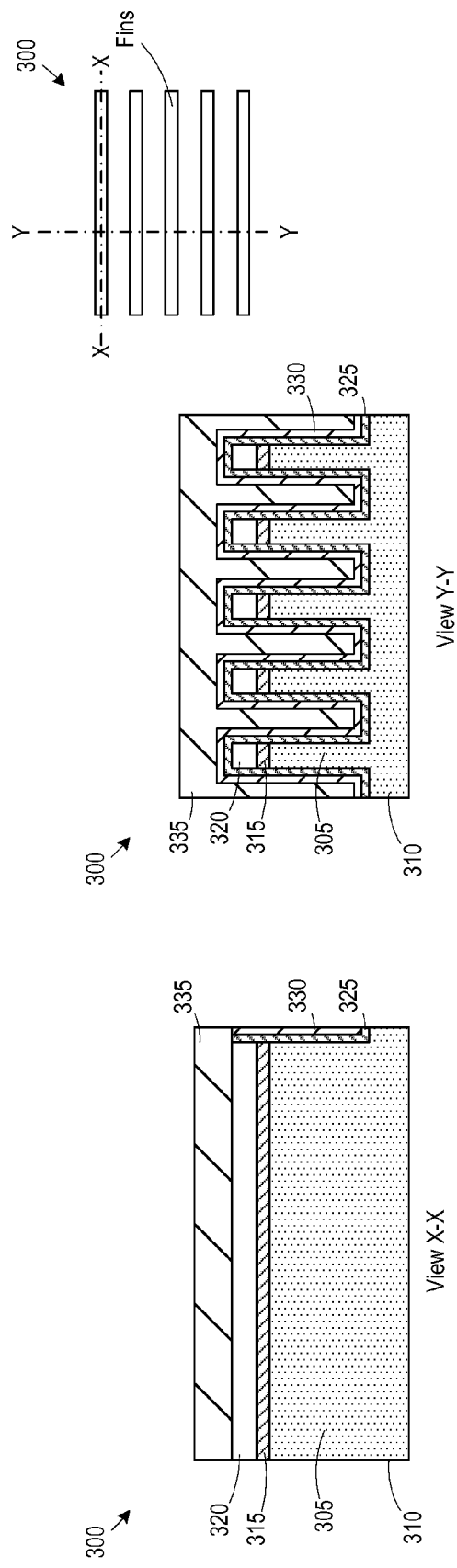

FIG. 3A depicts the product 300 at a point in fabrication wherein several process operations have been performed. First, the plurality of fins 305 were formed using cap layers 315, 320 (e.g., silicon dioxide and silicon nitride, respectively) as a patterned etch mask. In general, the fins 305 define an active region for forming devices, such as FinFET transistors. Next, liner layers 325, 330 (e.g., silicon dioxide and silicon nitride, respectively) were formed above the fins 305. Although a liner having two portions 325, 330 is shown, in some embodiments, more or less layers may be used in the liner. The illustrative product 300 disclosed herein is depicted as being comprised of five illustrative fins 305. However, as will be recognized by those skilled in the art after a complete reading of the present application, the methods and devices disclosed herein may be employed when manufacturing devices having any number of fins. A dielectric layer 335 (e.g., silicon dioxide, a low-k dielectric material, a flowable oxide, etc.) was then formed between the fins 305 to serve as an isolation structure.

Figure 3B:
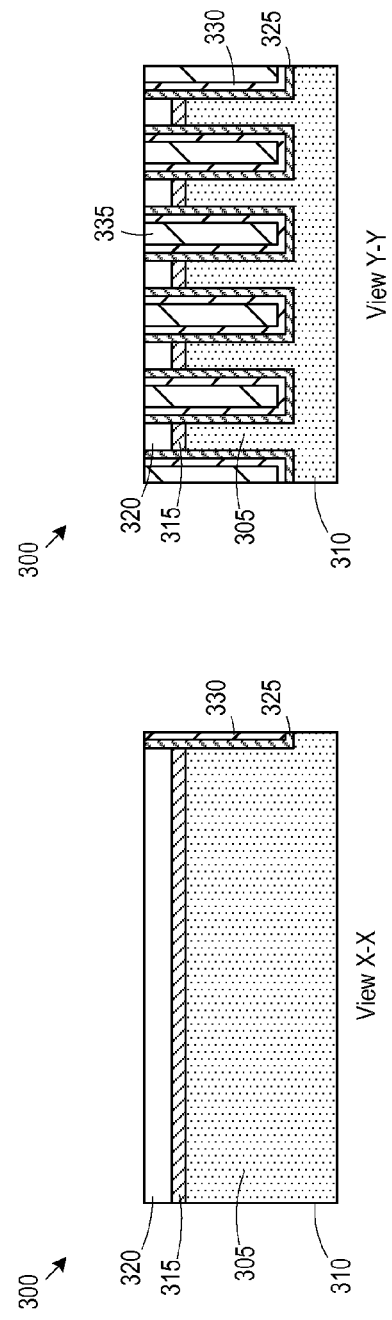

FIG. 3B illustrates the product 300 after a planarization process was performed to remove the portions of the dielectric layer 335 and the liner layers 325, 330 to expose the cap layer 320.

Figure 3C:
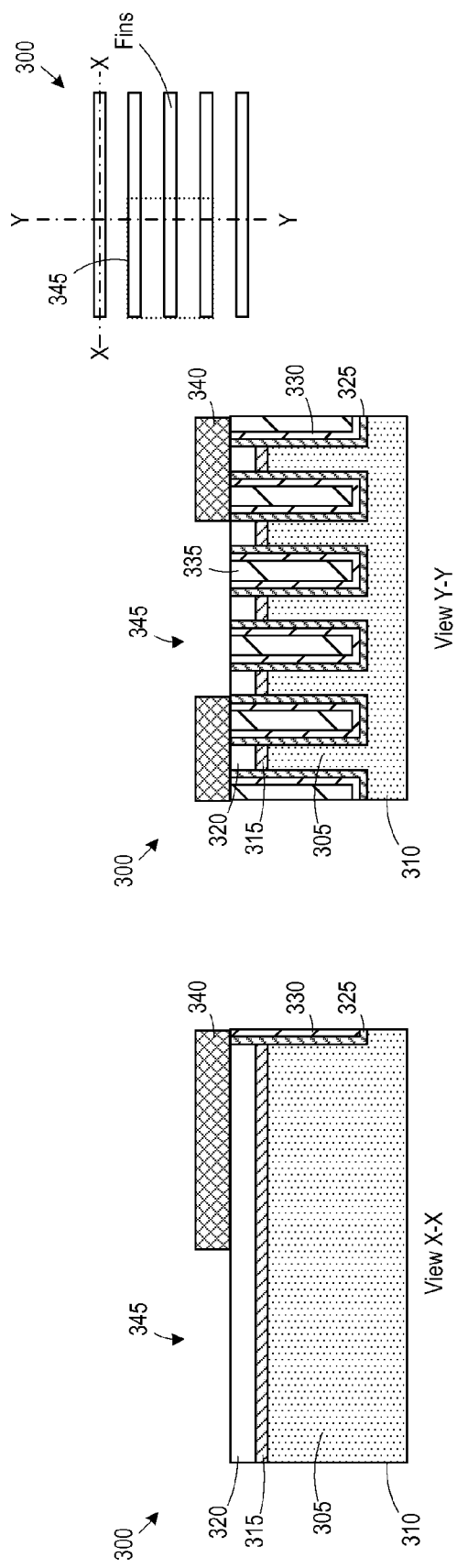

FIG. 3C illustrates the product 300 after a plurality of processes were performed to deposit and pattern a hard mask layer 340 above the dielectric layer 335. The hard mask layer 340 has an opening 345. In the illustrated embodiment, the hard mask layer 340 was formed using a photolithography stack, including an organic planarization (OPL) layer, an anti-reflective coating (ARC) layer, and a photoresist layer. The ARC layer was formed above the OPL layer, and the photoresist was formed above the ARC layer. The photoresist layer was exposed to radiation using a reticle and developed to generate a pattern. The photoresist pattern was transferred to the ARC and OPL layers, and the photoresist and ARC layers were removed. Thus, in some embodiments, the hard mask layer 340 may be the remaining OPL layer. In general, the opening 345 is sized based on the edges of the fins 305 that are to be removed rather than the edges of the liner layer 330. As described in greater detail below, this provides margin for overlay errors.

Figure 3D:
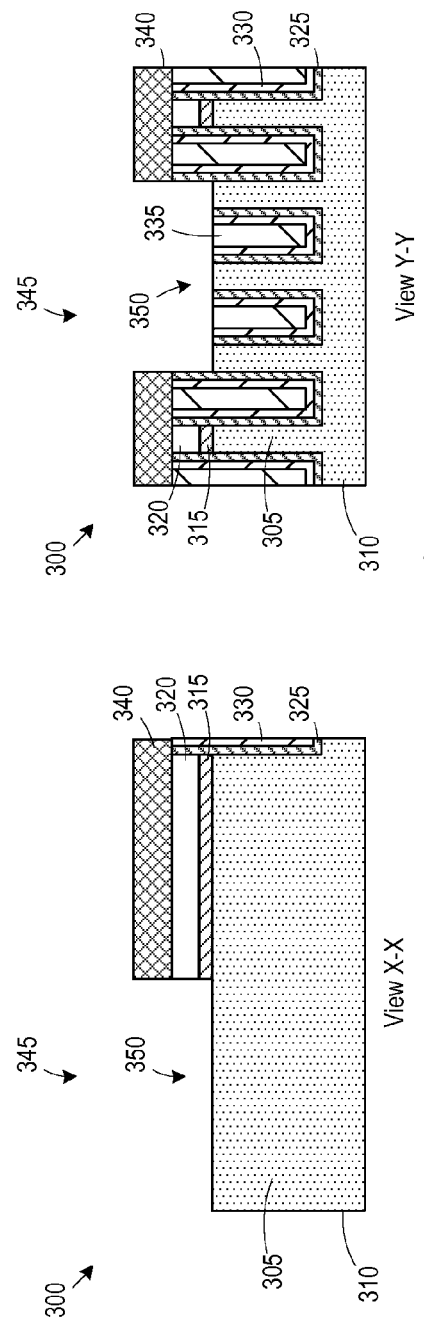

FIG. 3D illustrates the product 300 after an etch process (e.g., anisotropic reactive ion etch) was performed to remove the cap layers 315, 320, the liner layers 325, 330, and the dielectric material 335 exposed by the opening 345 to define a trench 350 having a bottom surface that exposes the top surface of the fins 305 to be subsequently removed.

Figure 3E:
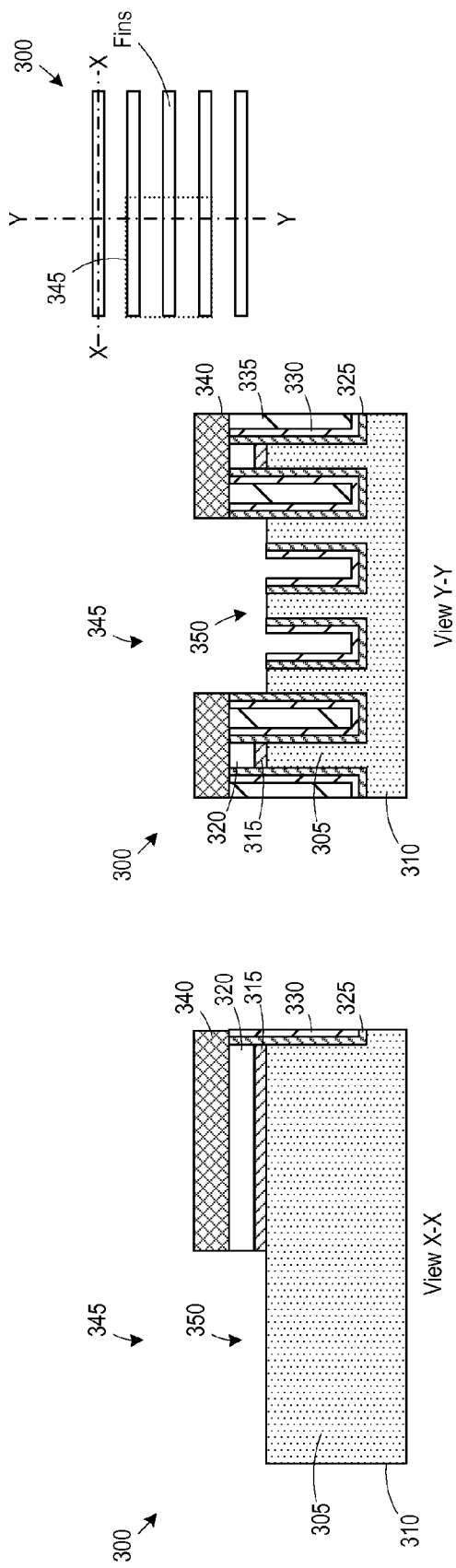

FIG. 3E illustrates the product 300 after an etch process (e.g., anisotropic reactive ion etch) was performed to etch the dielectric material 335 exposed by the opening 345 selectively to the materials of the fin 305 and the liner 325.

Figure 3F:
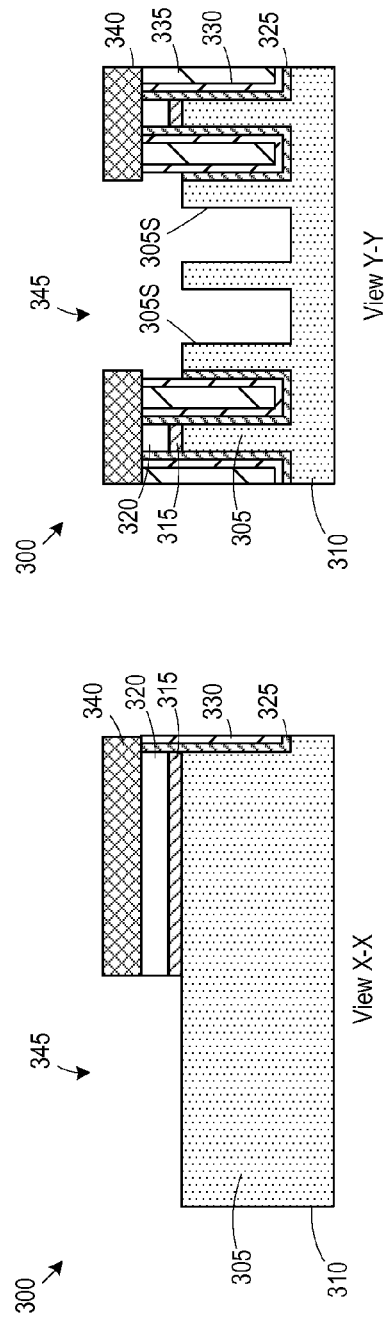

FIG. 3F illustrates the product 300 after one or more etch processes (e.g., isotropic etches) were performed to selectively remove the portions of the liners 325, 330 exposed by the opening 345, thereby exposing sidewalls 305S of the exposed fins 305.

FIG. 3G illustrates the product 300 after an isotropic etch process (i.e., RX cut) was performed to remove the portions of the fins 305 exposed by the opening 345. Because the sidewalls 305S of the fins 305 are exposed, the isotropic etch process may proceed in essentially all directions. That is, the etch front may proceed in a generally downward vertical direction from the top surface of the fins 305 toward the bulk of the substrate 310 and in a generally lateral or horizontal direction starting at the exposed sidewalls 305S, thereby significantly reducing the etch time and, subsequently, reducing the amount of undercutting at the end 305E of the fin 305. Of course, in actuality, the etch front may proceed along a front that is some form of a combination of the above-described vertical and horizontal directions, but by exposing the sidewalls 305S of the fins 305, the etch process can be performed much faster, thereby reducing the undercutting of the ends 305E of the fins 305 that are to be part of an operational device.

FIG. 3H illustrates the product 300 after an etch process was performed to remove the mask layer 340 and a deposition process was performed to deposit a dielectric layer 355 (e.g., silicon dioxide, a low-k dielectric material, a flowable oxide, etc.) above the fins 305 and after a planarization process was performed to expose the cap layer 320.

Further processing steps may be performed to complete the fabrication of the product 300, such as recessing of the dielectric layer 355 and removal of portions of the liners 325, 330 and cap layers 315, 320 to expose the remaining fins, forming a gate electrode, doping source and drain regions, forming contacts, etc.

Figures 4A, 4B:
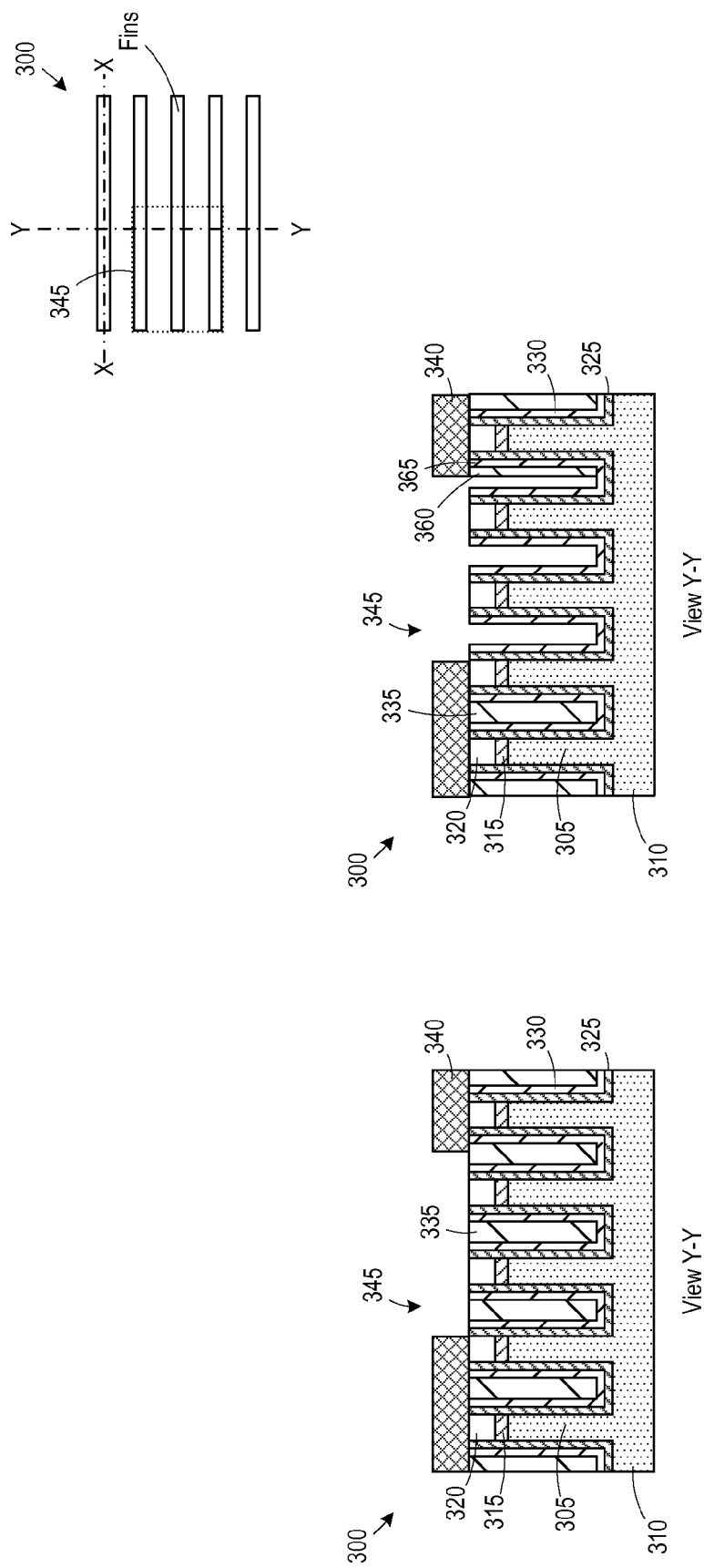
FIGS. 4A-4B depict a portion of the method of FIGS. 3A-3H under worst case overlay conditions.

In FIGS. 3C-3G, the opening 345 is illustrated as being formed with a best case overlay condition, where the edges of the opening 345 align with the edges of the fins 305 to be removed. FIG. 4A illustrates the product 300 with the opening 345 in the mask layer 340 being formed with worst case overlay conditions.

FIG. 4B illustrates the device 300 after an etch process (e.g., anisotropic reactive ion etch) was performed (similar to the etch illustrated in FIG. 3E) to etch the dielectric material 335 exposed by the opening 345 selectively to the materials of the fins 305 and the liner 325. Because the etch of the dielectric layer 335 is anisotropic, a portion 360 of the dielectric layer 335 remains covering the spacer 365 so that the spacer 365 is not removed during the subsequent isotropic spacer etches. The width of the opening 345 is selected such that if the worst case overlay condition were present, the fins 305 not located below the opening 345 will not be exposed during the subsequent etches. Thus, setting the width of the opening 345 based on the edges of the fins 305 instead of the edges of the liner layer 330 provides the margin necessary to handle overlay errors.

The process flow illustrated above has several advantages. Because RX cut etch proceeds on multiple fronts, the degree of undercutting is decreased. As a result, less margin needs to be provided in the fin length, and the process variability is reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method, comprising:
  forming a plurality of fins above a substrate;
  forming at least one dielectric material above and between said plurality of fins;
  forming a mask layer above said dielectric material, said mask layer having an opening defined therein;

removing a portion of said at least one dielectric material exposed by said opening to expose top and sidewall surface portions of at least a subset of said plurality of fins; and performing an etching process to remove said portions of said fins in said subset exposed by removing said portion of said at least one dielectric material.

2. The method of claim 1, wherein said opening exposes only a portion of a length of each fin in said subset.

3. The method of claim 1, wherein forming said dielectric material comprises forming a cap layer on top surface portions of said plurality of fins, and removing said dielectric material comprises removing portions of said cap layer exposed by said opening to expose said top surface portions of said fins in said subset.

4. The method of claim 1, wherein removing said dielectric material comprises forming a trench in said dielectric material to expose a top surface of said fins in said sub set.

5. The method of claim 4, wherein removing said dielectric material further comprises removing additional dielectric material to expose said sidewall surface portions of said fins in said subset.

6. The method of claim 1, wherein forming said dielectric material comprises:
   forming a cap layer on top surface portions of said plurality of fins;
   forming a liner layer above said cap layer and above said plurality of fins; and
   forming a dielectric layer above said liner layer and between said plurality of fins.

7. The method of claim 6, wherein removing said dielectric material comprises:
   performing a first etch process to define a trench in said dielectric material by removing portions of said cap layer, said liner layer and said dielectric layer to expose said top surface portions of said fins in said subset;
   performing a second etch process to selectively remove portions of said dielectric layer disposed between said fins in said subset and exposed by said opening to expose said liner layer; and
   performing a third etch process to selectively remove said liner layer disposed above said sidewall surface portions of said fins in said subset.

8. The method of claim 7, wherein said second etch processes comprises an anisotropic etch process selective to a material of said dielectric layer.

9. The method of claim 8, wherein said third etch process comprises at least one isotropic etch process selective to a material of said liner layer.

10. The method of claim 9, wherein said liner layer comprises a first liner layer and a second liner layer formed above said first liner layer, and said third etch process comprises a first isotropic etch process selective to a material of said second liner layer and a second isotropic etch process selective to a material of said first liner layer.

11. The method of claim 10, wherein said first liner comprises an oxide layer and said second liner layer comprises a nitride layer.

12. The method of claim 6, wherein removing said dielectric material comprises performing a first non-selective anisotropic etch process that removes portions of said cap layer, said liner layer and said dielectric layer.

13. A method, comprising:
   forming a plurality of fins above a substrate, each fin having a cap layer formed on a top surface;
   forming a liner layer above said plurality of fins and said cap layer;
   forming a dielectric layer above said liner layer;
   planarizing said dielectric layer to expose a top surface of said cap layer;
   forming a mask layer above said dielectric layer, said mask layer having an opening defined therein that exposes a portion of a length of each fin in a subset of said plurality of fins;
   removing a portion of said cap layer, said liner layer and said dielectric layer exposed by said opening to expose top and sidewall surface portions of said subset of fins; and
   performing an etching process to remove said portions of said fins in said subset exposed by removing said portion of said cap layer, said liner layer and said dielectric layer, said etching process proceeding along a first front defined along said top surface portions and a second front defined along said sidewall surface portions.

14. The method of claim 13, wherein said etching process comprises an isotropic etching process.

15. The method of claim 14, wherein removing said portion of said cap layer, said liner layer and said dielectric layer exposed by said opening comprises:
   performing a first etch process to define a trench in said cap layer, said liner layer and said dielectric layer to expose said top surface portions of said fins in said subset;
   performing a second etch process to selectively remove portions of said dielectric layer disposed between said fins in said subset and exposed by said opening to expose said liner layer; and
   performing a third etch process to selectively remove said liner layer disposed above said sidewall surface portions of said fins in said subset.

16. The method of claim 15, wherein said second etch processes comprises an anisotropic etch process selective to a material of said dielectric layer.

17. The method of claim 16, wherein said third etch process comprises at least one isotropic etch process selective to a material of said liner layer.

18. The method of claim 17, wherein said liner layer comprises a first liner layer and a second liner layer formed above said first liner layer, and said third etch process comprises a first isotropic etch process selective to a material of said second liner layer and a second isotropic etch process selective to a material of said first liner layer.

19. The method of claim 18, wherein said first liner comprises an oxide layer and said second liner layer comprises a nitride layer.

20. The method of claim 15, wherein said first etch process comprises a non-selective anisotropic etch that removes portions of said cap layer, said liner layer and said dielectric layer.

* * * * *